United States Patent
Haibi et al.

(10) Patent No.: US 10,083,755 B2
(45) Date of Patent: Sep. 25, 2018

(54) DISCHARGE CIRCUIT AND SEMICONDUCTOR MEMORY DEVICE

(71) Applicant: Toshiba Memory Corporation, Tokyo (JP)

(72) Inventors: Hicham Haibi, Fujisawa Kanagawa (JP); Katsuaki Sakurai, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/690,257

(22) Filed: Aug. 29, 2017

(65) Prior Publication Data

US 2018/0211706 A1     Jul. 26, 2018

(30) Foreign Application Priority Data

Jan. 26, 2017   (JP) ................ 2017-012218

(51) Int. Cl.
| | |
|---|---|
| *G11C 8/08* | (2006.01) |
| *G11C 16/08* | (2006.01) |
| *G11C 16/16* | (2006.01) |
| *G11C 16/26* | (2006.01) |

(52) U.S. Cl.
CPC ............ *G11C 16/08* (2013.01); *G11C 8/08* (2013.01); *G11C 16/16* (2013.01); *G11C 16/26* (2013.01)

(58) Field of Classification Search
CPC ......... G11C 7/12; G11C 8/08; G11C 11/4085; G11C 11/4091; G11C 16/08; G11C 16/26; G11C 16/16
See application file for complete search history.

(56) References Cited

U.S. PATENT DOCUMENTS

| | | | | |
|---|---|---|---|---|
| 4,821,234 A | * | 4/1989 | Nakase | G11C 8/08 |
| | | | | 365/203 |
| 5,576,641 A | * | 11/1996 | Yoneya | H03K 19/00361 |
| | | | | 326/83 |
| 5,654,645 A | | 8/1997 | Loth | |
| 6,438,032 B1 | * | 8/2002 | Pekny | G11C 5/145 |
| | | | | 365/185.18 |
| 7,161,387 B2 | * | 1/2007 | Yamasaki | H03K 3/356113 |
| | | | | 326/80 |

(Continued)

FOREIGN PATENT DOCUMENTS

JP      2013-201658 A    10/2013

*Primary Examiner* — Khamdan Alrobaie
(74) *Attorney, Agent, or Firm* — Patterson & Sheridan, LLP

(57) ABSTRACT

A discharge circuit includes first and second transistors of a first polarity, third and fourth transistors of a second polarity, and first and second current sources having first ends electrically connected to first end of the third transistor and first end of the fourth transistor, respectively, and second ends supplied with a first voltage. First end of the first transistor is supplied with a second voltage higher than the first voltage. First end of the second transistor is electrically separated from the first end of the first transistor. Gate and second end of the first transistor, gate of the second transistor, and second end of the third transistor are electrically connected to one another. Second end of the second transistor, gate of the third transistor, and second end and gate of the fourth transistor are electrically connected to one another.

20 Claims, 10 Drawing Sheets

(56) References Cited

U.S. PATENT DOCUMENTS

| | | | |
|---|---|---|---|
| 2003/0151952 A1* | 8/2003 | Gualandri | G11C 16/16 365/185.29 |
| 2005/0151527 A1* | 7/2005 | Noda | G05F 3/242 323/313 |
| 2013/0322886 A1* | 12/2013 | Uemura | H04B 10/50 398/135 |
| 2014/0300593 A1* | 10/2014 | Jang | H03K 17/223 345/212 |

* cited by examiner ated with word lines and bit lines. The
DISCHARGE CIRCUIT AND SEMICONDUCTOR MEMORY DEVICE This application is based upon and claims the benefit of priority from Japanese Patent Application No. 2017-012218, filed Jan. 26, 2017, the entire contents of which are incorporated herein by reference.

FIELD

Embodiments described herein relate generally to discharge circuits and semiconductor memory devices.

BACKGROUND

A NAND flash memory is known as a semiconductor memory device and a discharge circuit which is used in the NAND flash memory is also known.

DETAILED DESCRIPTION

Figure 1:
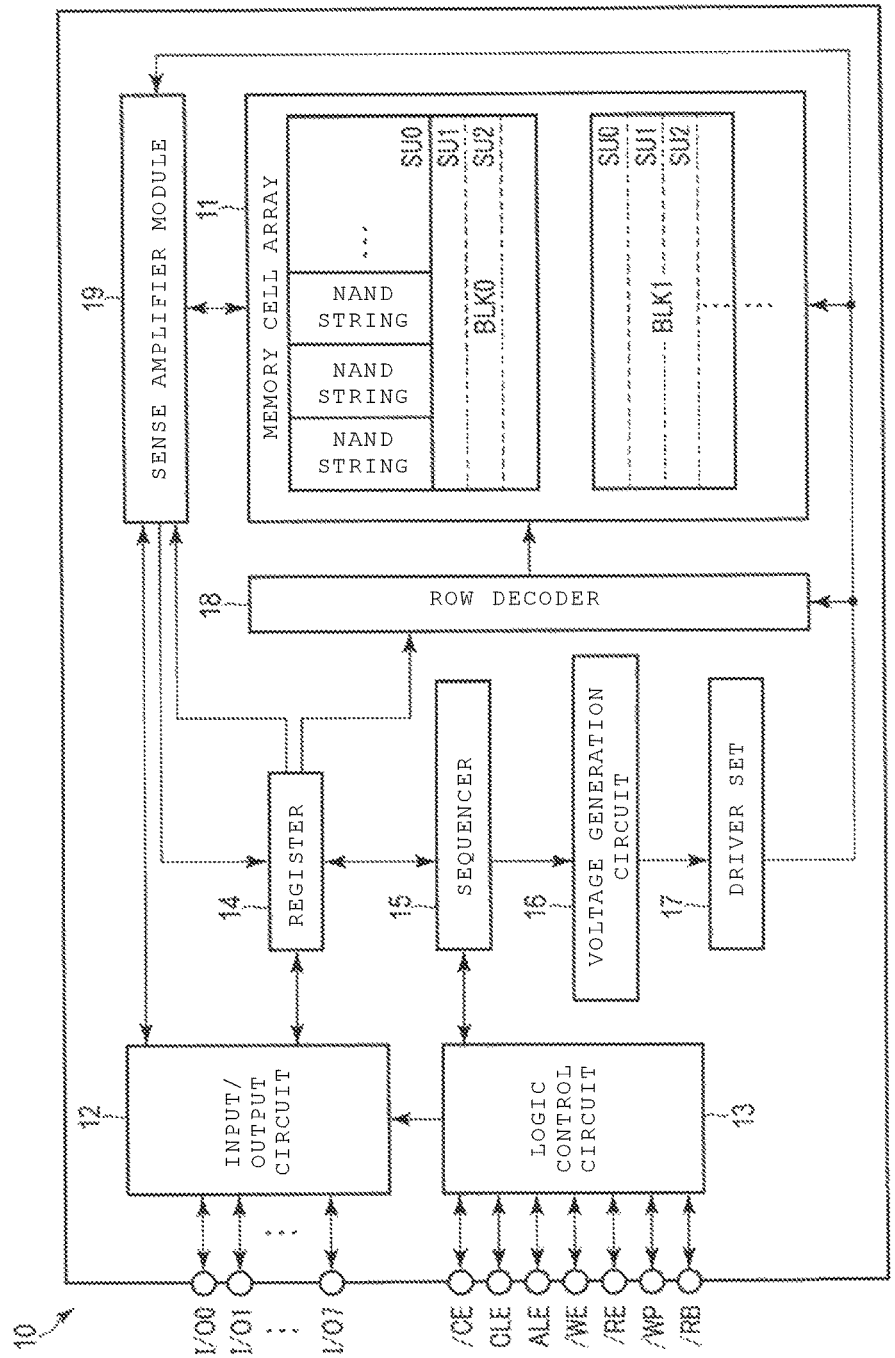
FIG. 1 is a block diagram of a semiconductor memory device according to a first embodiment.

Embodiments improve discharge characteristics of a discharge circuit used in a semiconductor memory device, while reducing a circuit area.

In general, according to one embodiment, a discharge circuit includes first and second transistors of a first polarity, third and fourth transistors of a second polarity different from the first polarity, and first and second current sources. The first current source has a first end electrically connected to a first end of the third transistor and a second end supplied with a first voltage, and the second current source has a first end electrically connected to a first end of the fourth transistor and a second end supplied with the first voltage. A first end of the first transistor is supplied with a second voltage higher than the first voltage. A first end of the second transistor is electrically separated from the first end of the first transistor. A gate and a second end of the first transistor, a gate of the second transistor, and a second end of the third transistor are electrically connected to one another. A second end of the second transistor, a gate of the third transistor, and a second end and a gate of the fourth transistor are electrically connected to one another.

Hereinafter, an embodiment will be described with reference to the drawings. It is to be noted that, in the following description, component elements having the same function and configuration will be identified with a common reference character. When component elements identified with a common reference character are distinguished from one another, suffixes are added to the common reference character to distinguish these component elements from one another. If there is no need to distinguish these component elements from one another, the component elements are simply identified with a common reference character without any suffix.

1. First Embodiment

A semiconductor memory device according to a first embodiment will be described.

1.1 Regarding the Configuration

First, the configuration of the semiconductor memory device according to the first embodiment will be described.

1.1.1 Regarding the Configuration of the Semiconductor Memory Device

A configuration example of the semiconductor memory device according to the first embodiment will be described by using FIG. 1.

As depicted in FIG. 1, a semiconductor memory device 10 includes a memory cell array 11, an input/output circuit 12, a logic control circuit 13, a register 14, a sequencer 15, a voltage generation circuit 16, a driver set 17, a row decoder 18, and a sense amplifier module 19.

The memory cell array 11 includes a plurality of blocks BLK (BLK0, BLK1, . . . ). The block BLK includes a plurality of nonvolatile memory cell transistors (not depicted in the drawing) correlated with word lines and bit lines. The block BLK is a data erasing unit, for example, and data in the same block BLK are collectively erased. Each block BLK includes a plurality of string units SU (SU0, SU1, SU2, . . . ). Each string unit SU is a group of NAND strings NS. Each NAND string NS includes a plurality of memory cell transistors. Each of the number of blocks in the memory cell array 11, the number of string units in one block BLK, and the number of NAND strings in one string unit SU may be any number.

The input/output circuit 12 sends and receives a signal I/O<7:0> (I/O0 to I/O7) to and from an external controller (not depicted in the drawing). The signal I/O<7:0> i an 8-bit signal, for example. The signal I/O<7:0> is the substance of data which is sent and received between the semiconductor memory device 10 and the external controller, and contains a command, an address, and data. The data includes write data and read data, for example. The input/output circuit 12 transfers the command and the address in the signal I/O<7:0> to the register 14. The input/output circuit 12 sends and receives the write data and the read data to and from the sense amplifier module 19.

The logic control circuit 13 receives signals /CE, CLE, ALE, /WE, /RE, and /WP from the external controller. Moreover, the logic control circuit 13 transfers a signal /RB to the external controller to notify the outside of the state of the semiconductor memory device 10. The signal /CE is a signal for enabling the semiconductor memory device 10. The signal CLE notifies the semiconductor memory device 10 that the signal I/O<7:0> flowing through the semiconductor memory device 10 while the signal CLE is at "H (High)" level is a command. The signal ALE notifies the semiconductor memory device 10 that the signal I/O<7:0> flowing through the semiconductor memory device 10 while the signal ALE is at "H" level is an address. The signal /WE gives an instruction to the semiconductor memory device 10 to take in the signal I/O<7:0> flowing through the semiconductor memory device 10 while the signal /WE is at "L (Low)" level. The signal /RE gives an instruction to the semiconductor memory device 10 to output the signal I/O<7:0>. The signal /WP gives an instruction to the semiconductor memory device 10 to disable writing and erasing of data. The signal /RB indicates whether the semiconductor memory device 10 is in a ready state (a state in which the semiconductor memory device 10 is ready to accept an instruction from the outside) or a busy state (a state in which the semiconductor memory device 10 is not ready to accept an instruction from the outside).

The register 14 holds the command and the address. The register 14 transfers the address to the row decoder 18 and the sense amplifier module 19 and transfers the command to the sequencer 15.

The sequencer 15 receives the command and controls the entire semiconductor memory device 10 in accordance with a sequence based on the received command.

The voltage generation circuit 16 generates voltages necessary for operations such as writing, reading, and erasing of data based on an instruction from the sequencer 15. The voltage generation circuit 16 supplies the generated voltages to the driver set 17.

The driver set 17 includes a plurality of drivers and supplies various voltages from the voltage generation circuit 16 to the row decoder 18 and the sense amplifier module 19 based on the address from the register 14. The driver set 17 supplies various voltages to the row decoder 18 based on a row address in the address, for example.

The row decoder 18 receives, from the register 14, the row address in the address and selects a block BLK based on the row address. Then, to the selected block BLK, the voltages from the driver set 17 are transferred via the row decoder 18.

At the time of reading of data, the sense amplifier module 19 senses the read data that has been read into a bit line from a memory cell transistor and transfers the sensed read data to the input/output circuit 12. At the time of writing of data, the sense amplifier module 19 transfers, to a memory cell transistor, write data to be written via a bit line. Moreover, the sense amplifier module 19 receives, from the register 14, a column address in the address and outputs data in a column based on the column address.

1.1.2 Regarding the Configuration of the Memory Cell Array

Next, the configuration of the memory cell array 11 of the semiconductor memory device 10 according to the first embodiment will be described by using FIG. 2.

Figure 2:
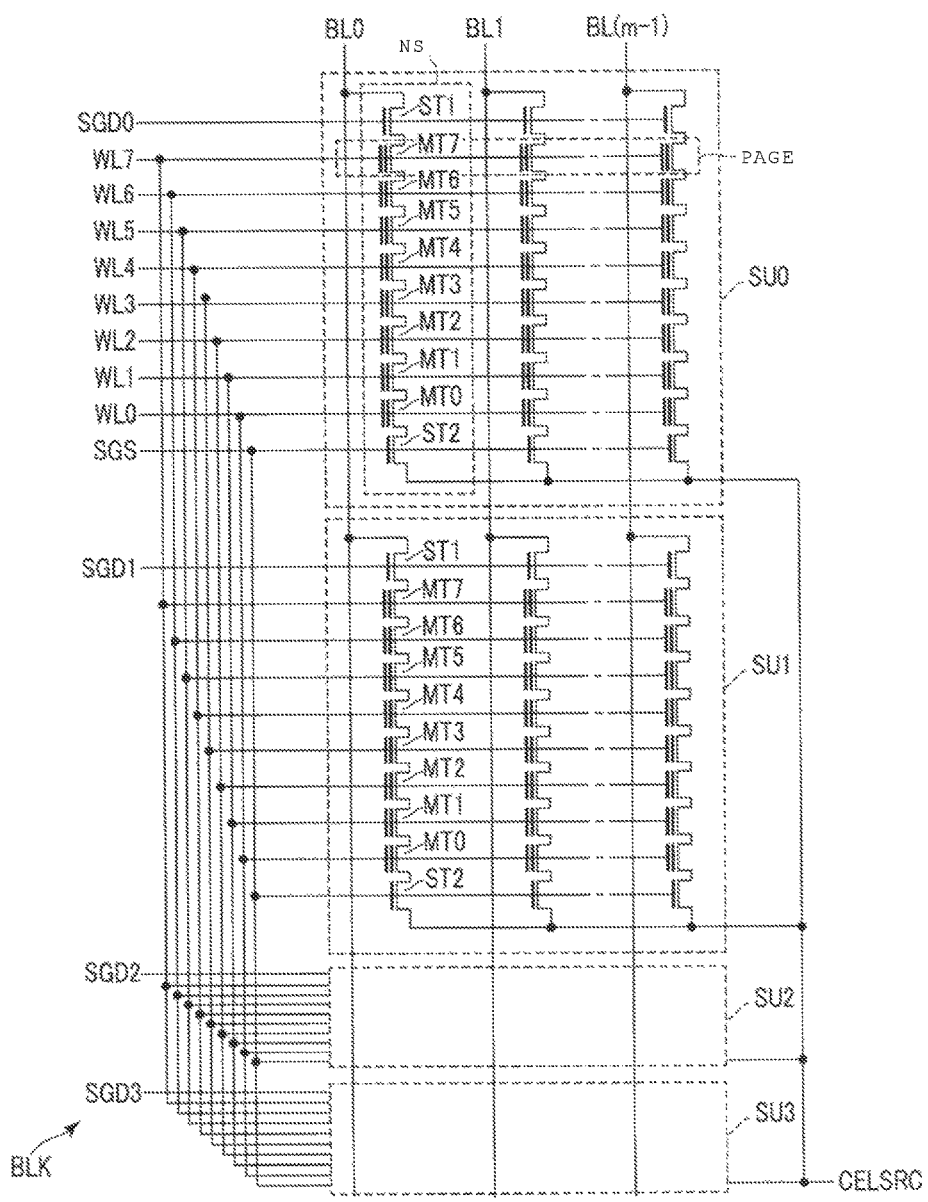
FIG. 2 is a circuit diagram of a memory cell array of the semiconductor memory device according to the first embodiment.

As depicted in FIG. 2, each of the NAND strings NS includes, for example, eight memory cell transistors MT (MT0 to MT7), a select transistor ST1, and a select transistor ST2. The number of memory cell transistors MT is not limited to 8 and may be 16, 32, 64, 128, or the like; the number of memory cell transistors MT is not limited to a particular number. Each memory cell transistor MT includes a stacked gate including a control gate and a charge storage layer. The memory cell transistors MT are connected in series between the select transistors ST1 and ST2. In the following description, "connected" includes a case where, between one thing and the other thing, a different conductive element is interposed (that is, one thing and the other thing are electrically connected).

In a certain block BLK, the gates of the select transistors ST1 of the string units SU0 to SU3 are connected to select gate lines SGD0 to SGD3, respectively. Moreover, the gates of the select transistors ST2 of all the string units SU in the block BLK are connected to a select gate line SGS. The control gates of the memory cell transistors MT0 to MT7 in the same block BLK are connected to word lines WL0 to WL7, respectively. That is, a word line WL of the same address is connected to all the string units SU in the same block BLK, and the select gate line SGS is connected to all the string units SU in the same block BLK. On the other hand, the select gate line SGD is connected to only one of the string units SU in the same block BLK.

Moreover, of the NAND strings NS disposed in a matrix in the memory cell array 11, the other ends of the select transistors ST1 of the NAND strings NS in the same row are connected to one of m bit lines BL (BL0 to BL (m−1) (m is a natural number)). Furthermore, the bit line BL is connected to the NAND strings NS in the same column in a plurality of blocks BLK.

In addition, the other ends of the select transistors ST2 are connected to a source line CELSRC. The source line CELSRC is connected to a plurality of NAND strings NS in a plurality of blocks BLK.

As described earlier, erasing of data is collectively performed on the memory cell transistors MT in the same block BLK, for example. On the other hand, reading and writing of data can be collectively performed on a plurality of memory cell transistors MT connected to any word line WL in any string unit SU of any block BLK. A unit by which collective reading or writing is performed in this manner is called a "page".

Figure 3:
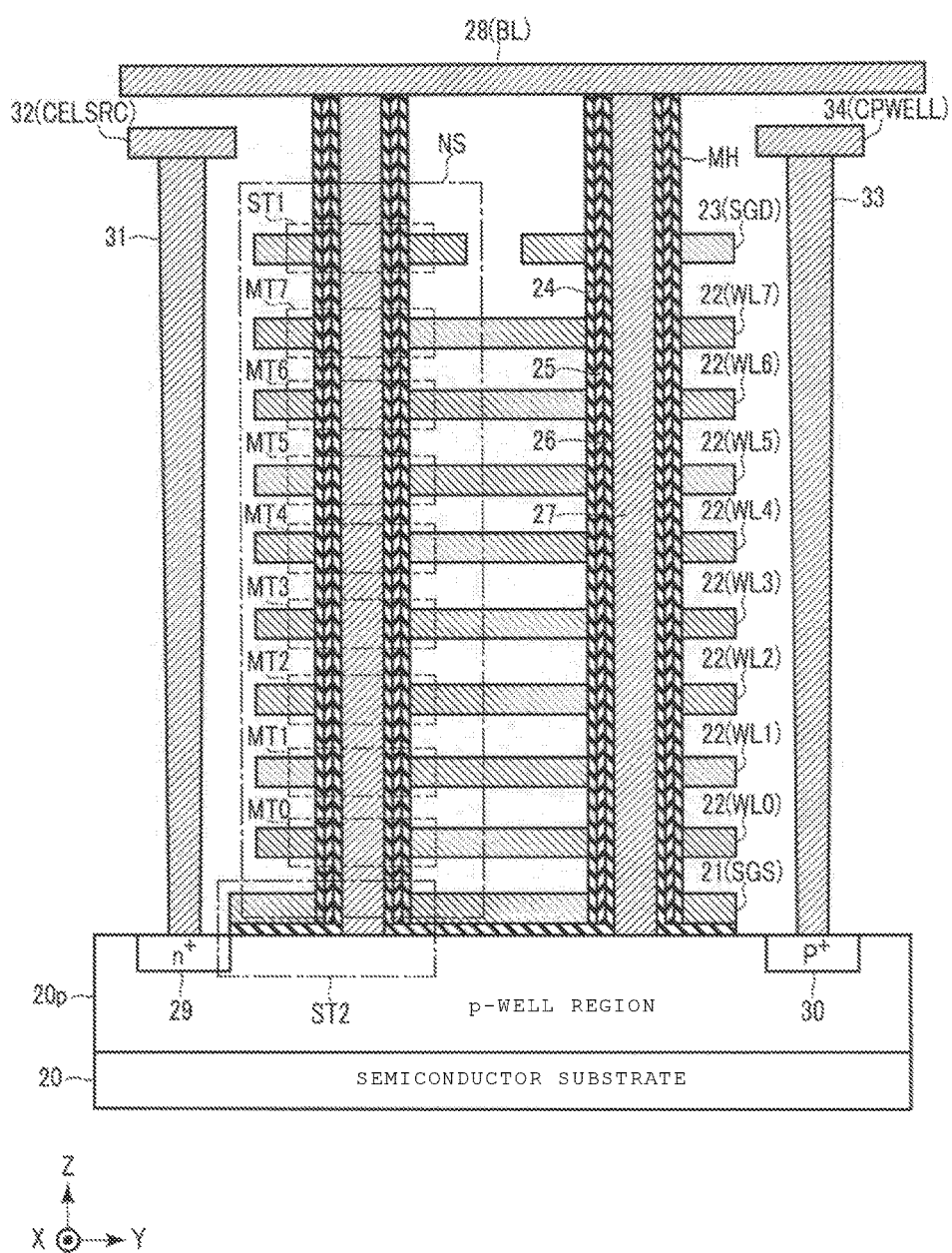
FIG. 3 is a sectional view of the memory cell array of the semiconductor memory device according to the first embodiment.

Next, the cross-section structure of the memory cell array 11 will be described by using FIG. 3. FIG. 3 depicts an example of the cross-section structure of part of the memory cell array 11 of the semiconductor memory device 10 according to the first embodiment. In particular, FIG. 3 depicts a portion related to two string units SU in one block BLK. Specifically, FIG. 3 depicts two NAND strings NS of two string units SU and the surrounding areas. In addition, a plurality of structures having the configuration depicted in FIG. 3 is arranged in an X direction; a group of a plurality of NAND strings NS arranged in the X direction corresponds to one string unit SU.

The semiconductor memory device 10 is provided on a semiconductor substrate 20. In the following description, a plane parallel to a front surface of the semiconductor substrate 20 will be referred to as an X-Y plane and a direction perpendicular to the X-Y plane is referred to as a Z direction. Moreover, the X direction and a Y direction are assumed to intersect at right angles.

On the semiconductor substrate 20, a p-well region 20p is provided. On the p-well region 20p, a plurality of NAND strings NS are provided. That is, on the p-well region 20p, for example, a wiring layer 21 functioning as the select gate line SGS, eight wiring layers 22 functioning as the word lines WL0 to WL7, and a wiring layer 23 functioning as the select gate line SGD are sequentially stacked. A plurality of wiring layers 21 and a plurality of wiring layers 23 may be provided in other embodiments. Between the stacked wiring layers 21 to 23, an insulating film (not shown) is provided.

The wiring layer 21 is connected to the gates of the select transistors ST2 of a plurality of NAND strings NS in one block BLK, for example. Each of the wiring layers 22 is connected to the control gates of the memory cell transistors MT of the plurality of NAND strings NS in one block BLK. The wiring layer 23 is connected to the gates of the select transistors ST1 of a plurality of NAND strings NS in one string unit SU.

A memory hole MH is provided so as to reach the p-well region 20p after passing through the wiring layers 23, 22, and 21. On the side face of the memory hole MH, a block insulating film 24, a charge storage layer 25, and a tunnel oxide film 26 are provided in order. A semiconductor pillar 27 is embedded in the memory hole MH. The semiconductor pillar 27 is undoped polysilicon, for example, and functions as a current path of the NAND string NS. On an upper end of the semiconductor pillar 27, a wiring layer 28 functioning as the bit line BL is provided.

As described above, above the p-well region 20p, the select transistor ST2, the plurality of memory cell transistors MT, and the select transistor ST1 are stacked in order, and one memory hole MH corresponds to one NAND string NS.

In an upper portion of the p-well region 20p, an n+ impurity dispersion region 29 and a p+ impurity dispersion region 30 are provided. On an upper surface of the n+ impurity dispersion region 29, a contact plug 31 is provided. On an upper surface of the contact plug 31, a wiring layer 32 functioning as the source line CELSRC is provided. On an upper surface of the p+ impurity dispersion region 30, a contact plug 33 is provided. On an upper surface of the contact plug 33, a wiring layer 34 functioning as a well line CPWELL is provided.

It is to be noted that other configurations may be adopted as the configuration of the memory cell array 11, such as the configurations described in, for example, U.S. patent application Ser. No. 12/407,403 entitled "Three Dimensional Stacked Nonvolatile Semiconductor Memory" filed Mar. 19, 2009, U.S. patent application Ser. No. 12/406,524 entitled "Three Dimensional Stacked Nonvolatile Semiconductor Memory" filed Mar. 18, 2009, U.S. patent application Ser. No. 12/679,991 entitled "Nonvolatile Semiconductor Memory Device and Method of Manufacturing the Same" filed Mar. 25, 2010, and U.S. patent application Ser. No. 12/532,030 entitled "Semiconductor Memory and Method of Manufacturing the Same" filed Mar. 23, 2009. The entire contents of all of these patent applications are incorporated herein by reference.

1.1.3 Regarding the Configuration of the Row Decoder

Next, the configuration of the row decoder 18 of the semiconductor memory device 10 according to the first embodiment will be described by using FIG. 4.

Figure 4:
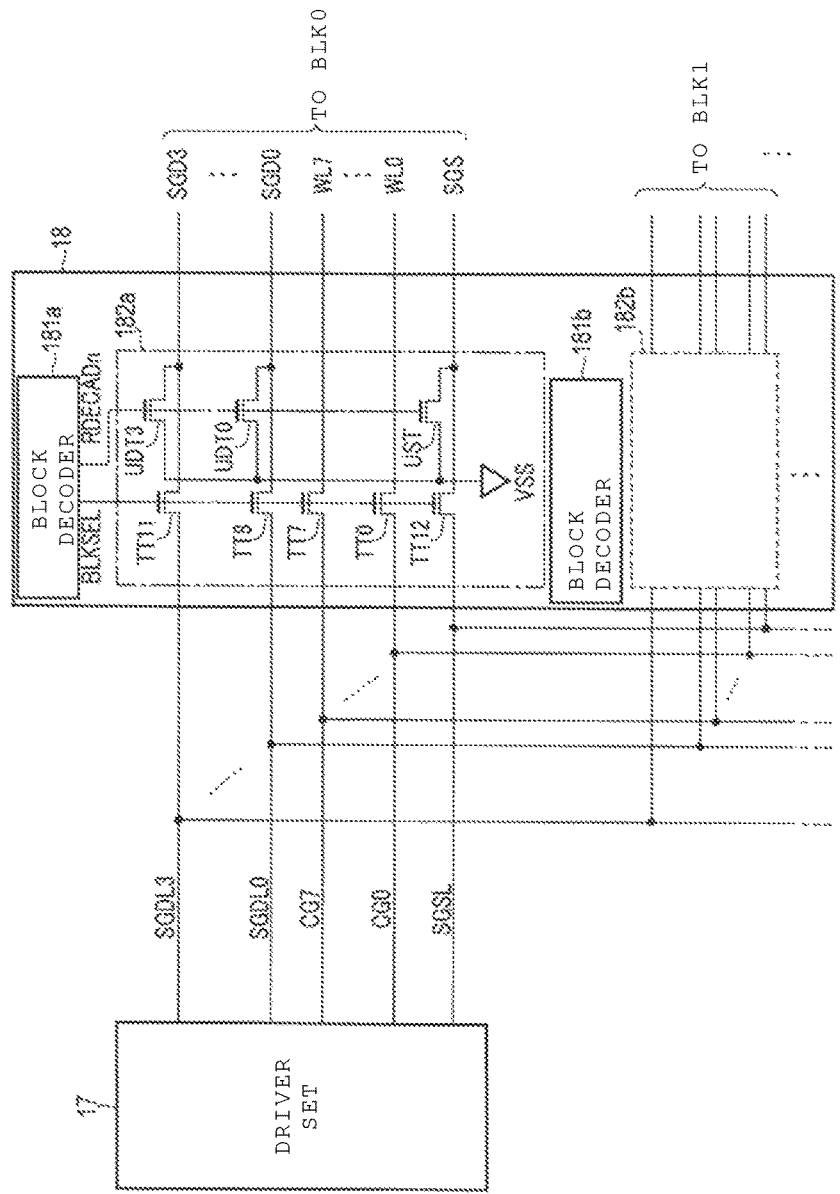
FIG. 4 is a circuit diagram of a row decoder of the semiconductor memory device according to the first embodiment.

As depicted in FIG. 4, the row decoder 18 includes a plurality of block decoders 181 (181a, 181b, . . . ) and a plurality of transfer switch groups 182 (182a, 182b, . . . ). The transfer switch groups 182 each include transistors TT0 to TT12, UDT0 to UDT3, and UST.

One block decoder 181 and one transfer switch group 182 are allocated to one block BLK. In the example of FIG. 4, the block decoder 181a and the transfer switch group 182a are allocated to the block BLK0, and the block decoder 181b and the transfer switch group 182b are allocated to the block BLK1. In the following description, a block BLK on which writing, reading, and erasing are to be performed will be referred to as a selected block BLK.

At the time of writing, reading, and erasing of data, the block decoder 181 decodes a block address signal received from the register 14. As a result of decoding, if the block decoder 181 determines that the block BLK corresponding to the block decoder 181 is a selected block BLK, the block decoder 181 outputs a signal BLKSEL at "H" level and a signal RDECADn at "L" level. Moreover, if the block decoder 181 determines that the corresponding block BLK is not a selected block BLK, the block decoder 181 outputs the signal BLKSEL at "L" level and the signal RDECADn at "H" level. The signal BLKSEL is a voltage that brings the transistors TT0 to TT12 into an ON state at "H" level and brings the transistors TT0 to TT12 into an OFF state at "L" level. The signal RDECADn is a voltage that brings the transistors UDT0 to UDT3 and UST into an ON state at "H" level and brings the transistors UDT0 to UDT3 and UST into an OFF state at "L" level.

The transistors TT0 to TT7 are provided to transfer the voltages to the word lines WL0 to WL7, respectively, of the selected block BLK. First ends of the transistors TT0 to TT7 are connected to the word lines WL0 to WL8, respectively, of the corresponding block BLK, second ends of the transistors TT0 to TT7 are connected to signal lines CG0 to CG7, respectively, and the gates of the transistors TT0 to TT7 are connected to a signal line BLKSEL.

The transistors TT8 to TT11 and UDT0 to UDT3 are provided to transfer the voltages to the select gate lines SGD0 to SGD3, respectively, of the selected block BLK. First ends of the transistors TT8 to TT11 are connected to the select gate lines SGD0 to SGD3, respectively, of the corresponding block BLK, second ends of the transistors TT8 to TT11 are connected to signal lines SGDL0 to SGDL3, respectively, and the gates of the transistors TT8 to TT11 are connected to the signal line BLKSEL. Moreover, first ends of the transistors UDT0 to UDT3 are connected to the select gate lines SGD0 to SGD3, respectively, of the corresponding block BLK, second ends of the transistors UDT0 to UDT3 are grounded at a voltage VSS, and the gates of the transistors UDT0 to UDT3 are connected to a signal line RDECADn.

The transistors TT12 and UST are provided to transfer the voltage to the select gate line SGS of the selected block BLK. A first end of the transistor TT12 is connected to the select gate line SGS of the corresponding block BLK, a second end of the transistor TT12 is connected to a signal line SGSL, and the gate of the transistor TT12 is connected to the signal line BLKSEL. Moreover, a first end of the transistor UST is connected to the select gate line SGS of the corresponding block BLK, a second end of the transistor UST is grounded at the voltage VSS, and the gate of the transistor UST is connected to the signal line RDECADn.

Therefore, for example, in the transfer switch group 182 corresponding to the selected block BLK, the transistors TT0 to TT12 enter an ON state and the transistors UGT0 to UGT3 and UST enter an OFF state. As a result, the word lines WL0 to WL7 are connected to the signal lines CG0 to CG7, respectively, the select gate lines SGD0 to SGD3 are connected to the signal lines SGDL0 to SGDL3, respectively, and the select gate line SGS is connected to the signal line SGSL.

On the other hand, in the transfer switch group 182 corresponding to a non-selected block BLK, the transistors TT0 to TT12 enter an OFF state and the transistors UGT0 to UGT3 and UST enter an ON state. As a result, the word lines WL are separated from the signal lines CG and the select gate lines SGD and SGS are separated from the signal lines SGDL and SGSL, respectively.

The driver set 17 supplies the voltages to the signal lines CG, SGDL, and SGSL in accordance with the address received from the register 14. The signal lines CG, SGDL, and SGSL transfer the various voltages supplied from the driver set 17 to each of the transfer switch groups 182a, 182b, . . . . That is, the voltages supplied from the driver set 17 are transferred to the word lines WL and the select gate lines SGD and SGS in the selected block BLK via the transistors TT0 to TT12 in the transfer switch group 182 corresponding to the selected block BLK.

1.1.4 Regarding the Configuration of the Block Decoder

Next, the configuration of the block decoder 181 of the semiconductor memory device 10 according to the first embodiment will be described by using FIG. 5.

Figure 5:
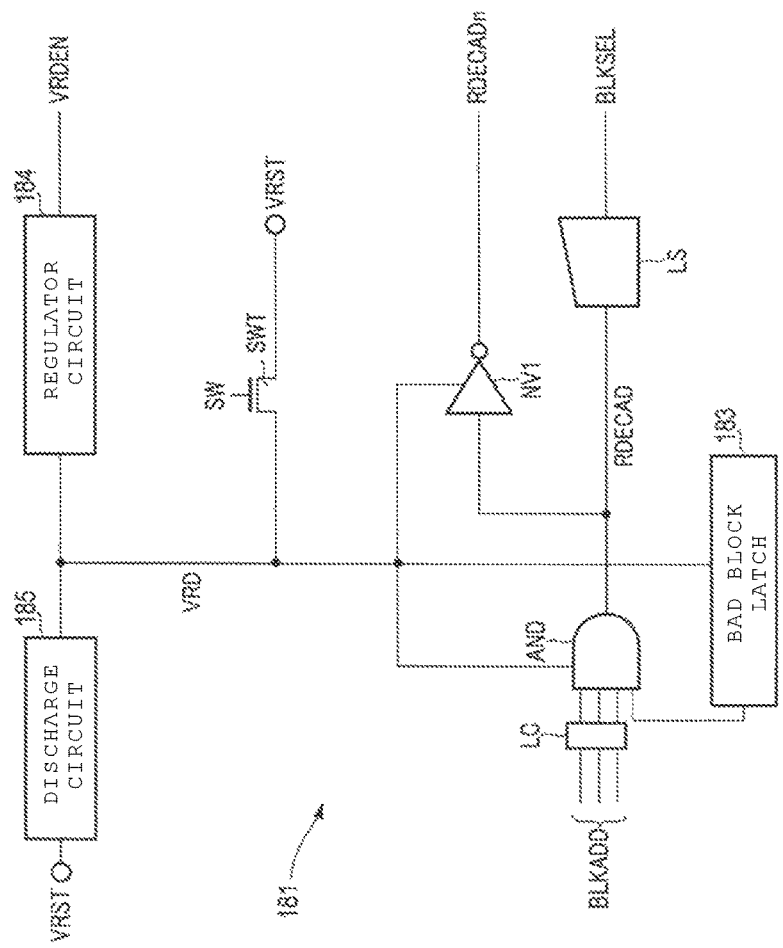
FIG. 5 is a circuit diagram of a block decoder of the semiconductor memory device according to the first embodiment.

As depicted in FIG. 5, the block decoder 181 includes a logic circuit LC, an AND circuit AND, an inverter NV1, a level shifter LS, a bad block latch 183, a transistor SWT, a regulator circuit 184, and a discharge circuit 185.

The logic circuit LC outputs output signals based on a block address signal BLKADD input from the register 14. In the block decoder 181 of the block that the block address signal BLKADD is addressing, all the output signals of the logic circuit LC are at "H" level; in the block decoder 181 of the block that the block address signal BLKADD is not addressing, any one of the output signals of the logic circuit LC is at "L" level.

The bad block latch 183 holds information as to whether or not the corresponding block BLK is normal and outputs an output signal based on the information. For instance, if the corresponding block BLK is normal, the bad block latch 183 outputs an output signal at "H" level to the AND circuit AND; if the corresponding block BLK is not normal, the bad block latch 183 outputs an output signal at "L" level thereto.

The AND circuit AND outputs, as a signal RDECAD, the AND result of the output signals of the logic circuit LC and the bad block latch 183 to the inverter NV and the level shifter LS. That is, in the block decoder 181 of the block that the block address signal BLKADD is addressing and a determination is made that the corresponding block BLK is normal, the signal RDECAD at "H" level is output. Moreover, in the block decoder 181 of the block that the block address signal BLKADD is not addressing or a determination is made that the corresponding block BLK is not normal, the signal RDECAD at "L" level is output.

The inverter NV1 inverts the signal RDECAD which is output from the AND circuit AND. As a result of inversion, the inverter NV1 outputs a signal RDECADn.

The level shifter LS boosts the voltage value of the signal RDECAD to an appropriate voltage value with a boosted voltage (for example, 30 V) being set at a target voltage. As a result of the voltage value being boosted, the level shifter LS outputs a signal BLKSEL. Specifically, if the level shifter LS receives the signal RDECAD at "H" level input thereto, the level shifter LS outputs the signal BLKSEL at "H" level boosted to the boosted voltage; if the level shifter LS receives the signal RDECAD at "L" level input thereto, the level shifter LS outputs the signal BLKSEL at "L" level.

With the above configuration, the block decoder 181 outputs the signals BLKSEL and RDECADn having different logic levels to the transfer switch group 182.

The AND circuit AND, the bad block latch 183, and the inverter NV1 are driven by a voltage which is supplied via a node VRD, for example. A voltage which is supplied to the node VRD is controlled by the transistor SWT, the regulator circuit 184, and the discharge circuit 185.

The regulator circuit 184 is a circuit for supplying a voltage to the logic circuit AND, the bad block latch 183, and the inverter NV1 via the node VRD, for example. If a signal VRDEN at "H" level is input to the regulator circuit 184, the regulator circuit 184 enters an active state; if the signal VRDEN at "L" level is input to the regulator circuit 184, the regulator circuit 184 enters a non-active state. In an active state, the regulator circuit 184 supplies a voltage V_RD to the node VRD; in a non-active state, the regulator circuit 184 brings the node VRD into a high-impedance state while keeping the node VRD at the voltage V_RD. The voltage V_RD is a voltage that can drive the AND circuit AND, the bad block latch 183, and the inverter NV1 and is 3.0 V, for example. The voltage V_RD is supplied to the block decoder 181 in a period (in the following description, also referred to as an "active period") in which the block decoder 181 is driven in various operations such as writing, reading, and erasing of data into and from the memory cell transistor MT, for example.

The transistor SWT has a first end which is supplied with a voltage VRST and a second end which is connected to the node VRD, and the gate of the transistor SWT is connected to a signal line SW. The transistor SWT enters an ON state as a result of "H" level being input to the signal line SW and supplies the voltage VRST to the node VRD. Moreover, the transistor SWT enters an OFF state as a result of "L" level being input to the signal line SW and separates the node VRD from the voltage VRST. The voltage VRST is a power-supply voltage connected to the other circuit which is not depicted in the drawing and is 2.5 V, for example. Furthermore, the voltage VRST is a voltage which is lower than the voltage V_RD and can drive the AND circuit AND, the bad block latch 183, and the inverter NV1 to the extent that the information held in the bad block latch 183 is not lost. The voltage VRST is supplied to the block decoder 181 in a period (in the following description, also referred to as a "stand-by period") in which various operations such as writing, reading, and erasing of data into and from the memory cell transistor MT, for example, are not performed.

The discharge circuit 185 decreases the voltage at the node VRD from the voltage V_RD by discharging the voltage at the node VRD. Moreover, the voltage VRST is supplied to the discharge circuit 185, and, when the voltage at the node VRD decreases to the voltage VRST as a result of discharge, the discharge circuit 185 causes the discharge operation to be stopped.

1.1.4 Regarding the Configuration of the Discharge Circuit

Next, the configuration of the discharge circuit 185 of the semiconductor memory device 10 according to the first embodiment will be described by using FIGS. 6 and 7.

Figure 6:
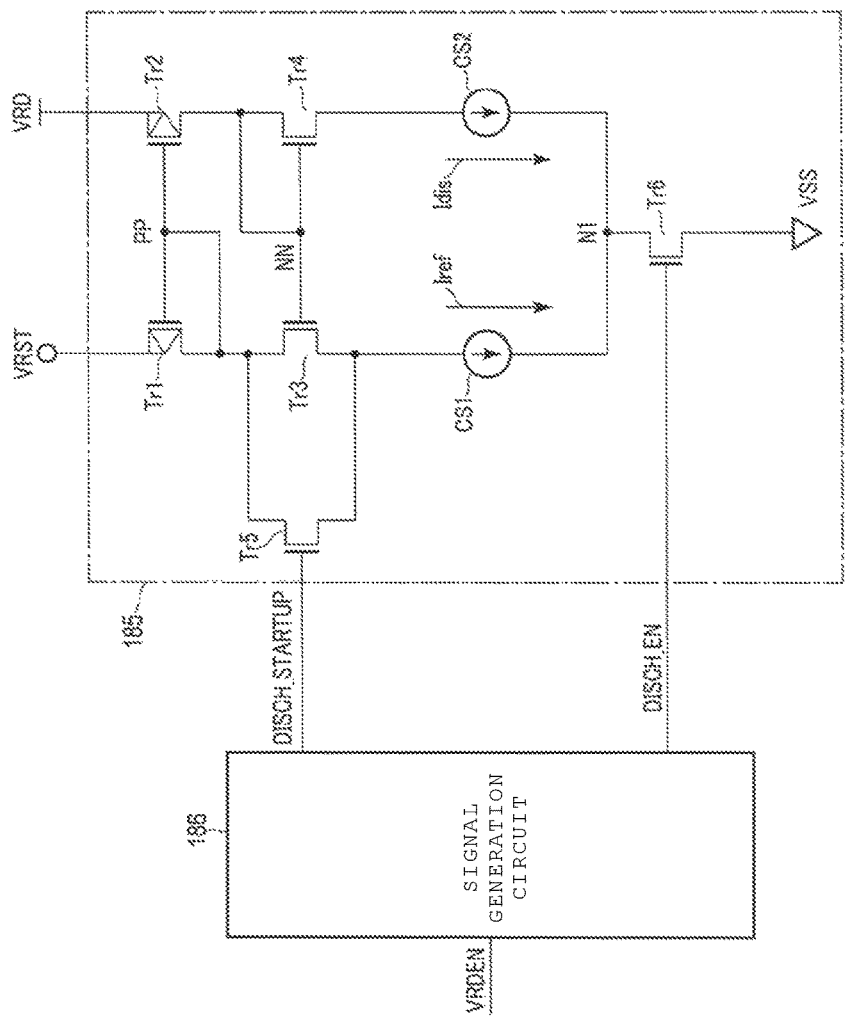
FIG. 6 is a circuit diagram of a discharge circuit of the semiconductor memory device according to the first embodiment.

As depicted in FIG. 6, the discharge circuit 185 is driven by signals DISCH_STARTUP and DISCH_EN which are output from a signal generation circuit 186. The discharge circuit 185 includes transistors Tr1 and Tr2 with p-channel polarity, transistors Tr3, Tr4, Tr5, and Tr6 with n-channel polarity, and constant current sources CS1 and CS2. The discharge circuit 185 includes a current path on a left branch via the transistors Tr1 and Tr3 and the constant current source CS1 and a current path on a right branch via the transistors Tr2 and Tr4 and the constant current source CS2.

The transistors Tr1 and Tr2 have the same threshold voltage, for example. To a first end and the back gate of the transistor Tr1, the voltage VRST is supplied, and a second end and the gate of the transistor Tr1 are connected to a node PP. A first end and the back gate of the transistor Tr2 are connected to the node VRD, a second end of the transistor Tr2 is connected to a node NN, and the gate of the transistor Tr2 is connected to the node PP.

The transistors Tr3 and Tr4 have the same threshold voltage, for example. A first end of the transistor Tr3 is connected to the node PP, a second end of the transistor Tr3 is connected to a first end of the constant current source CS1, and the gate of the transistor Tr3 is connected to the node NN. A first end and the gate of the transistor Tr4 are connected to the node NN and a second end of the transistor Tr4 is connected to a first end of the constant current source CS2.

The transistors Tr1 to Tr4 may have different sizes. However, the size ratio between the transistors Tr1 and Tr2 preferably coincides with the size ratio between the transistors Tr3 and Tr4. The size of a transistor is the proportion (W/L) of a gate width W to a gate length L, for example. The size ratio between two transistors is the proportion of the size of the other transistor to the size of one transistor.

A first end of the transistor Tr5 is connected to the node PP, a second end of the transistor Tr5 is connected to the first end of the constant current source CS1, and the signal DISCH_STARTUP is input to the gate of the transistor Tr5. The transistor Tr5 enters an ON state by the signal DISCH_STARTUP at "H" level and enters an OFF state by the signal DISCH_STARTUP at "L" level.

A first end of the transistor Tr6 is connected to a node N1, a second end of the transistor Tr6 is grounded at the voltage VSS (for example, 0 V), and the signal DISCH_EN is connected to the gate of the transistor Tr6. The transistor Tr6 enters an ON state by the signal DISCH_EN at "H" level and enters an OFF state by the signal DISCH_EN at "L" level.

The constant current sources CS1 and CS2 include transistors whose gates are connected to each other, for example. Currents Iref and Idis flow through the constant current sources CS1 and CS2, respectively. The constant current sources CS1 and CS2 are each configured such that a constant current value flows therethrough if a difference between the voltages which are supplied to the first and second ends is sufficiently large. In the following description, the values of the currents Iref and Idis which are observed when the above-described constant current value flows, are referred to as current values Ic1 and Ic2, respectively.

The current value Ic2 is greater than the current value Ic1, for example. Preferably, the proportion (N=Ic2/Ic1) of the current value Ic2 to the current value Ic1 coincides with the proportion of the size of the transistor Tr2 to the size of the transistor Tr1 and the proportion of the size of the transistor Tr4 to the size of the transistor Tr3. In the following description, a state in which the proportion of the size of a certain element provided on the current path on the left branch to the size of an element which is provided on the current path on the right branch and corresponds to the certain element, substantially coincides with the proportion of the size of another element provided on the current path on the left branch to the size of an element which is provided on the current path on the right branch and corresponds to the other element, is also referred to as "a size match is provided". By providing a size match while setting the sizes of the transistors Tr1 to Tr4 and the constant current sources CS1 and CS2 at appropriate values, the discharge pattern of the voltage at the node VRD can be made to have a linear shape in a desired period in a discharge operation, which will be described later.

The signal VRDEN is input to the signal generation circuit 186 and the signals DISCH_STARTUP and DISCH_EN are output therefrom.

Figure 7:
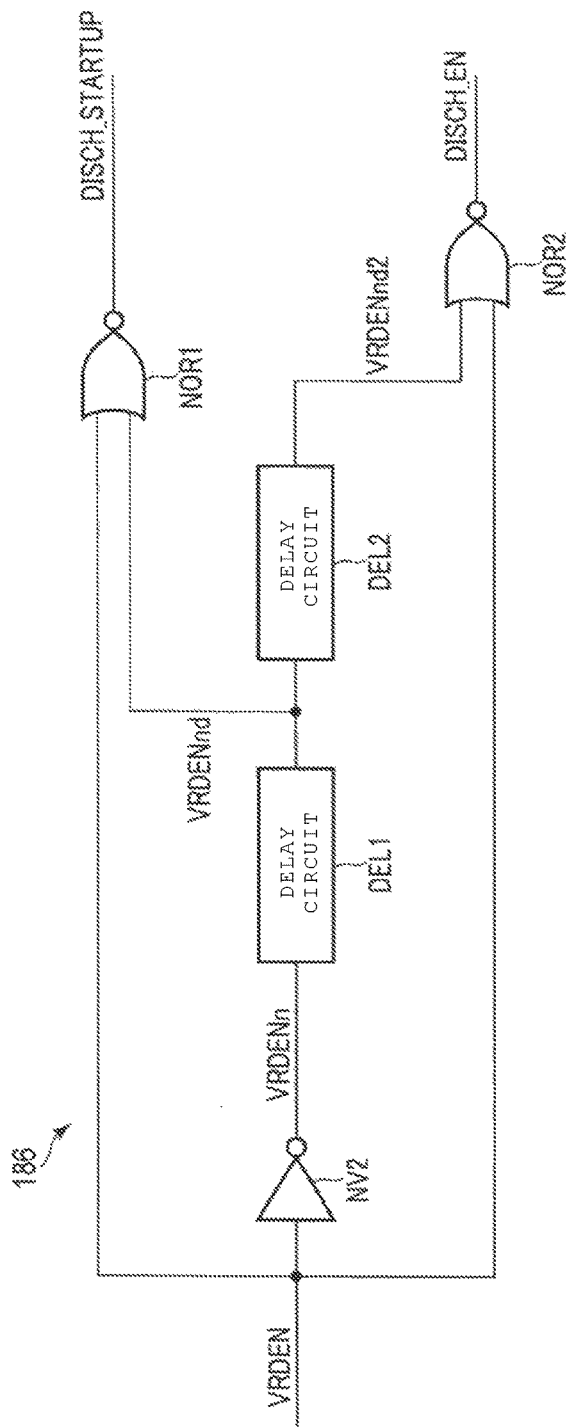
FIG. 7 is a circuit diagram for explaining signals which are input to the discharge circuit of the semiconductor memory device according to the first embodiment.

As depicted in FIG. 7, the signal generation circuit 186 includes an inverter NV2, delay circuits DEL1 and DEL2, and NOR circuits NOR1 and NOR2.

The inverter NV2 receives the signal VRDEN input thereto and outputs a signal VRDENn obtained by inverting the signal VRDEN. The delay circuit DEL1 receives the signal VRDENn input thereto and outputs a signal VRDENnd obtained by delaying the signal VRDENn by a first delay period (for example, 20 ns). The NOR circuit NOR1 receives the signals VRDEN and VRDENnd input thereto and outputs the result of the NOR operation performed on the signals VRDEN and VRDENnd as a signal DISCH_STARTUP. That is, as the signal DISCH_STARTUP, a pulse signal having the width of the first delay period is generated. A pulse of the signal DISCH_STARTUP functions as a trigger for the discharge operation by the discharge circuit 185.

The delay circuit DEL2 receives the signal VRDENnd input thereto and outputs a signal VRDENnd2 obtained by delaying the signal VRDENnd by a second delay period (for example, 500 ns) longer than the first delay period. The NOR circuit NOR2 receives the signals VRDEN and VRDENnd2 and outputs the result of the NOR operation performed on the signals VRDEN and VRDENnd2 as a signal DISCH_EN. That is, as the signal DISCH_EN, a pulse signal having the width of the second delay period is generated. Moreover, a pulse of the signal DISCH_EN rises concurrently with the pulse of the signal DISCH_STARTUP and defines an operable period of the discharge operation by the discharge circuit 185.

1.2 Regarding the Discharge Operation

Figure 8:
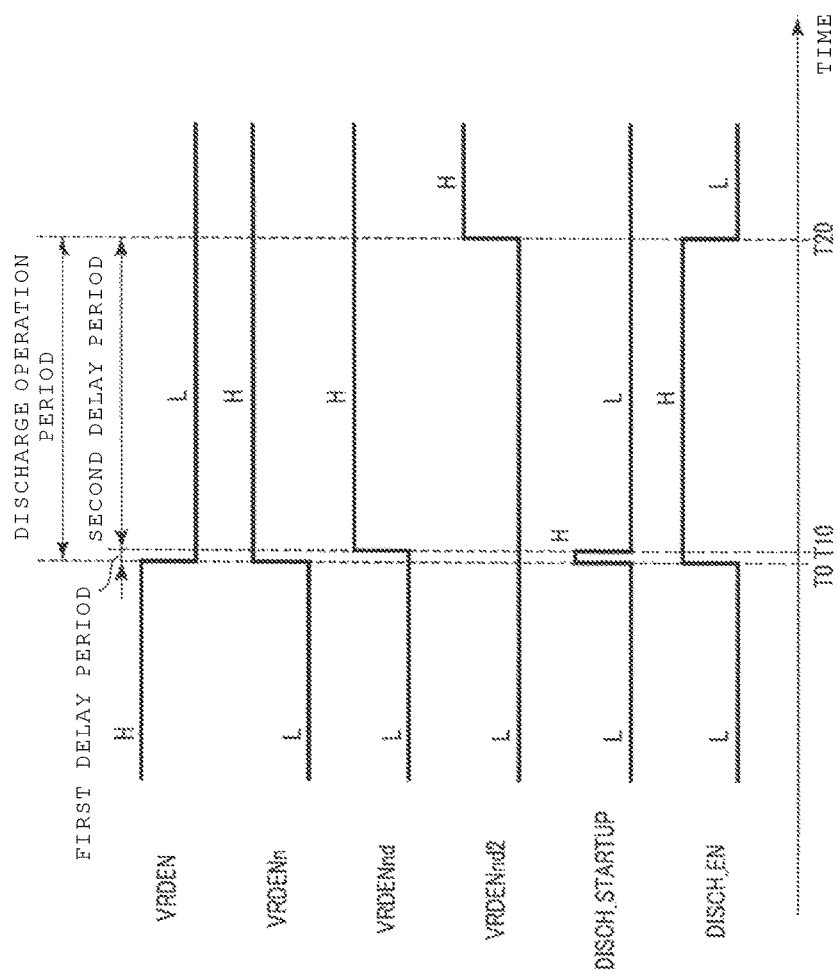
FIG. 8 is a timing chart for explaining a discharge operation of the semiconductor memory device according to the first embodiment.

Next, an example of the discharge operation of the semiconductor memory device 10 according to the first embodiment will be described by using FIGS. 8 and 9. In the following description, a size match between the left branch and the right branch in the discharge circuit 185 is assumed to be provided.

First, an operation of the signal generation circuit 186 will be described by using FIG. 8. As depicted in FIG. 8, a period from time T0 to time T10 corresponds to the first delay period and a period from time T10 to time T20 corresponds to the second delay period. In addition, a period from time T0 to time T20 corresponds to a discharge operation period. Moreover, a period before time T0 corresponds to the active period and a period after time T0 corresponds to the stand-by period.

Until time T0, the signal VRDEN at "H" level is input to the inverter NV2 and the NOR circuits NOR1 and NOR2. In response thereto, the inverter NV2, the delay circuit DEL1, the delay circuit DEL2, the NOR circuit NOR1, and the NOR circuit NOR2 output the signals VRDENn, VRDENnd, VRDENnd2, DISCH_STARTUP, and DISCH_EN at "L" level, respectively.

At time T0, the signal VRDEN at "L" level is input to the inverter NV2 and the NOR circuits NOR1 and NOR2. In response thereto, the inverter NV2 outputs the signal VRDENn at "H" level to the delay circuit DEL1. Since the delay circuit DEL1 keeps outputting the signal VRDENnd at "L" level to the NOR circuit NOR1 and the delay circuit DEL2 until time T10, the NOR circuit NOR1 outputs the signal DISCH_STARTUP at "H" level. Moreover, since the delay circuit DEL2 continues to output the signal VRDENnd2 at "L" level to the NOR circuit NOR2, the NOR circuit NOR2 outputs the signal DISCH_EN at "H" level.

At time T10, the delay circuit DEL1 outputs the signal VRDENnd at "H" level to the NOR circuit NOR1 and the delay circuit DEL2. In response thereto, the NOR circuit NOR1 outputs the signal DISCH_STARTUP at "L" level. Since the delay circuit DEL2 keeps outputting the signal VRDENnd2 at "L" level to the NOR circuit NOR2 until time T20, the NOR circuit NOR2 outputs the signal DISCH_EN at "H" level.

At time T20, the delay circuit DEL2 outputs the signal VRDENnd2 at "H" level to the NOR circuit NOR2. In response thereto, the NOR circuit NOR2 outputs the signal DISCH_EN at "L" level.

Next, an operation of the discharge circuit 185 will be described by using FIG. 9. A period from time T0 to time T20 in FIG. 9 corresponds to the discharge operation period from time T0 to time T20 in FIG. 8. The discharge operation period is divided into three periods (I) to (III), for example. The period (I) corresponds to a period from time T0 to time T11, the period (II) corresponds to a period from time T11 to time T12, and the period (III) corresponds to a period from time T12 to time T20.

Figure 9:
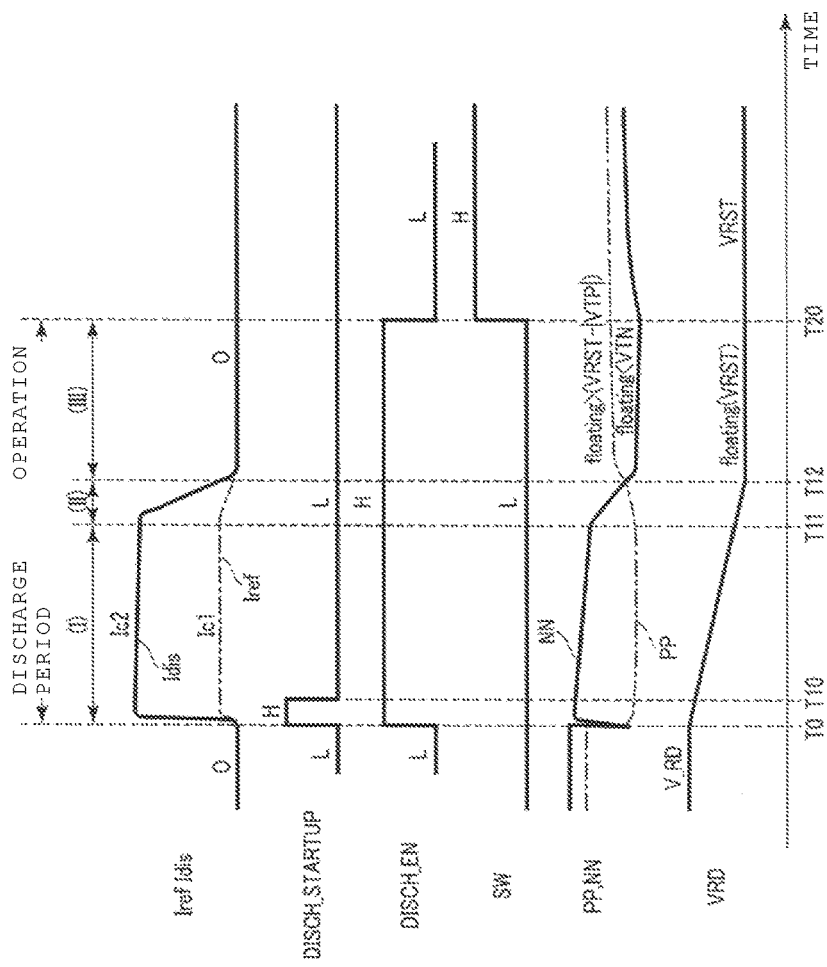
FIG. 9 is a timing chart for explaining the discharge operation of the semiconductor memory device according to the first embodiment.

As depicted in FIG. 9, until time T0, the signal DISCH_EN is at "L" level and the discharge operation is not started. Moreover, as a result of the signal at "L" level being input to the gate of the transistor SWT from the signal line SW, the transistor SWT enters an OFF state. As a result, until time T0, the voltage V_RD is supplied to the node VRD from the regulator circuit 184.

At time T0, the signals DISCH_STARTUP and DISCH_EN become "H" level and the discharge operation is started. That is, as a result of the signal VRDEN becoming "L" level, the node VRD is separated from the regulator circuit 184 and enters a floating state. Moreover, when the signals DISCH_STARTUP and DISCH_EN at "H" level are input to the gates of the transistors Tr5 and Tr6, respectively, the transistors Tr5 and Tr6 enter an ON state. As a result, the node PP is connected to a ground potential via the transistors Tr5 and Tr6 and the transistors Tr1 and Tr2 enter an ON state. As a result of the transistor Tr2 entering an ON state, the node NN is connected to the node VRD and the transistors Tr3 and Tr4 enter an ON state. As a result of the transistor Tr4 entering an ON state, the node VRD is connected to the ground potential via the transistors Tr2 and Tr4, the constant current source CS2, and the transistor Tr6. As a result, the voltage at the node NN momentarily decreases, and the current Idis having the current value Ic2 flows through the current path on the right branch from the node VRD toward the ground potential. Moreover, as a result of the transistor Tr3 entering an ON state, the voltage VRST is connected to the ground potential via the transistors Tr1 and Tr3, the constant current source CS1, and the transistor Tr6. As a result, the current Iref having the current value Ic1 flows through the current path on the left branch from the voltage VRST to the ground potential. As described above, although the signal DISCH_STARTUP becomes "L" level at time T10, since the transistors Tr1 and Tr3 already entered an ON state, the discharge operation is not stopped by the change in the signal DISCH_STARTUP at time T10.

In the period (I), the voltage at the node VRD decreases linearly as a result of discharge. In response thereto, the voltage at the node NN gradually decreases. However, the transistors Tr3 and Tr4 are still in an ON state to the extent that the transistors Tr3 and Tr4 can pass the current Iref having the current value Ic1 and the current Idis having the current value Ic2, respectively. As a result, the currents Iref and Idis do not change due to the transistors Tr3 and Tr4, respectively. Moreover, the voltage at the node PP makes the transistors Tr1 and Tr2 enter an ON state to the extent that the transistors Tr1 and Tr2 can pass the current Iref having the current value Ic1 and the current Idis having the current value Ic2, respectively. As a result, the currents Iref and Idis do not change due to the transistors Tr1 and Tr2. As described above, in the period (I), the currents Iref and Idis take the constant current values Ic1 and Ic2, respectively.

At time T11, as a result of a decrease in the voltage at the node NN, the transistors Tr3 and Tr4 enter an ON state to the extent that the transistors Tr3 and Tr4 cannot pass the current Idis having the current value Ic2. That is, the currents Iref and Idis decrease as a result of a decrease in the voltage at the node NN. Since the voltage VRST is always supplied to the first end of the transistor Tr1, when the current Iref decreases, the voltage at the node PP increases. As a result, the gate-source voltage of the transistors Tr1 and Tr2 decreases, which further prevents the currents Iref and Idis from flowing. As described above, in the period (II), the transistors Tr1 to Tr4 operate as a positive feedback circuit and the currents Iref and Idis decrease with a decrease in the voltage at the node NN.

At time T12, the voltage at the node VRD reaches the voltage VRST. Moreover, the voltage at the node PP and the voltage at the node NN become equal to each other. As a result, an imbalance between the current path via the transistors Tr1 and Tr3 and the current path via the transistors Tr2 and Tr4 is eliminated and the discharge is stopped. That is, the current values of the currents Iref and Idis become almost "0". The voltage at the node NN continues to decrease, and, when the voltage at the node NN reaches a voltage lower than a threshold voltage VTN of the transistor Tr3, the voltage makes the transistor Tr3 enter an OFF state and the node PP enter a floating state. Moreover, the voltage at the node PP continues to increase, and, when the voltage at the node PP reaches a voltage higher than a voltage (VRST−|VTP|), the voltage makes the transistor Tr2 enter an OFF state and the node NN enter a floating state. The voltage VTP is the threshold voltage of the transistors Tr1 and Tr2.

At time T20, the signal DISCH_EN at "L" level is input to the gate of the transistor Tr6 and the node N1 is separated from the ground potential. Then, the signal at "H" level is input to the gate of the transistor SWT from the signal line SW, and the transistor SWT enters an ON state. As a result, the voltage VRST is supplied to the node VRD via the transistor SWT.

This is the end of the discharge operation.

1.3 Effect of the Present Embodiment

The first embodiment can improve the discharge characteristics while reducing a circuit area. This effect will be described below.

In the discharge circuit 185 according to the first embodiment, the voltage VRST is supplied to the first end of the transistor Tr1 and the first end of the transistor Tr2 is connected to the node VRD. The gate and the second end of the transistor Tr1, the gate of the transistor Tr2, and the first end of the transistor Tr3 are connected to the node PP. As a result, the voltage at the node VRD can be discharged in accordance with the voltage VRST.

Moreover, the second end of the transistor Tr2, the gate of the transistor Tr3, and the gate and the first end of the transistor Tr4 are connected to the node NN. When the current Idis decreases with a decrease in the voltage at the node NN, the current Iref also decreases in response to a decrease in the current Idis. The voltage at the node PP increases in response to a decrease in the current Iref. When the voltage at the node PP increases, the current Idis further decreases. As described above, as a result of the transistors Tr1 to Tr4 operating as a positive feedback circuit, when the voltage at the node VRD decreases and reaches the voltage VRST, the voltage at the node NN becomes equal to the voltage at the node PP. As a result, the discharge can be automatically stopped when the voltage at the node VRD reaches the voltage VRST.

As another technique of stopping the discharge at a desired voltage, a technique using a digital limiter is known. However, since this technique uses a parameter, a configuration becomes complicated and a circuit area may be eventually increased. On the other hand, the discharge circuit according to the first embodiment can implement a simpler circuit configuration while reducing a circuit area than the configuration using a digital limiter.

Moreover, as a result of the constant current source CS1 that passes the current value Ic1 and the constant current source CS2 that passes the current value Ic2 greater than the current value Ic1 being provided, a large amount of current can be passed through the current path on the right branch which is to be discharged. On the other hand, a current that is passed through the current path on the left branch can be made to be relatively small.

Furthermore, the size ratio between the transistor Tr1 and the transistor Tr2 and the size ratio between the transistor Tr3 and the transistor Tr4 coincide with the ratio between the magnitude of the current value Ic1 and the magnitude of the current value Ic2. As a result, when the size of the transistor Tr1 and the size of the transistor Tr2 are different from each other and also when the size of the transistor Tr3 and the size of the transistor Tr4 are different from each other, the voltage at the node VRD can be decreased linearly until the voltage at the node VRD is discharged from the voltage V_RD to the voltage VRST. In general, a nonlinear discharge pattern is not desirable because a period in which a very small current flows lasts for a long time in a period close to the end of the discharge, which makes a period in which slight discharge is performed last for a long time. Therefore, as compared to a case where the voltage at the node VRD is nonlinearly discharged, the time required for discharge can be shortened.

Moreover, if the node VRD at the voltage V_RD which is a higher voltage level than the voltage VRST is connected to the power supply that supplies the voltage VRST, there is a possibility that the voltage VRST overshoots under the influence of coupling between the voltage VRST and the node VRD, which affects the other circuit supplied with the voltage VRST. The semiconductor memory device 10 according to the first embodiment is provided with the block decoder 181 including the above-described discharge circuit 185. In the active period, the block decoder 181 supplies the voltage V_RD to the node VRD, and, when the active period transitions to the stand-by period, the block decoder 181 operates the discharge circuit 185 to discharge the voltage at the node VRD from the voltage V_RD to the voltage VRST. Then, after the completion of the discharge, the block decoder 181 supplies the voltage VRST to the node VRD. As a result, when the active period transitions to the stand-by period, the node VRD at the voltage VRST can be connected to the power supply that supplies the voltage VRST. Since the voltage VRST at the node VRD is set at a value which is almost the same as the voltage VRST, the influence which is exerted on the voltage VRST from the node VRD can be reduced. Therefore, at the time of transition to the stand-by period, the influence which affects the other circuit supplied with the voltage VRST can be reduced.

2 Others

The discharge circuit 185 according to the first embodiment is not limited to the above-described example and can be modified in various ways. For example, the above description deals with an example in which, in the discharge circuit 185 according to the first embodiment, the transistor Tr2 is one transistor which is different from the transistor Tr1 in size and the transistor Tr4 is one transistor which is different from the transistor Tr3 in size, but an embodiment is not limited thereto.

Figure 10:
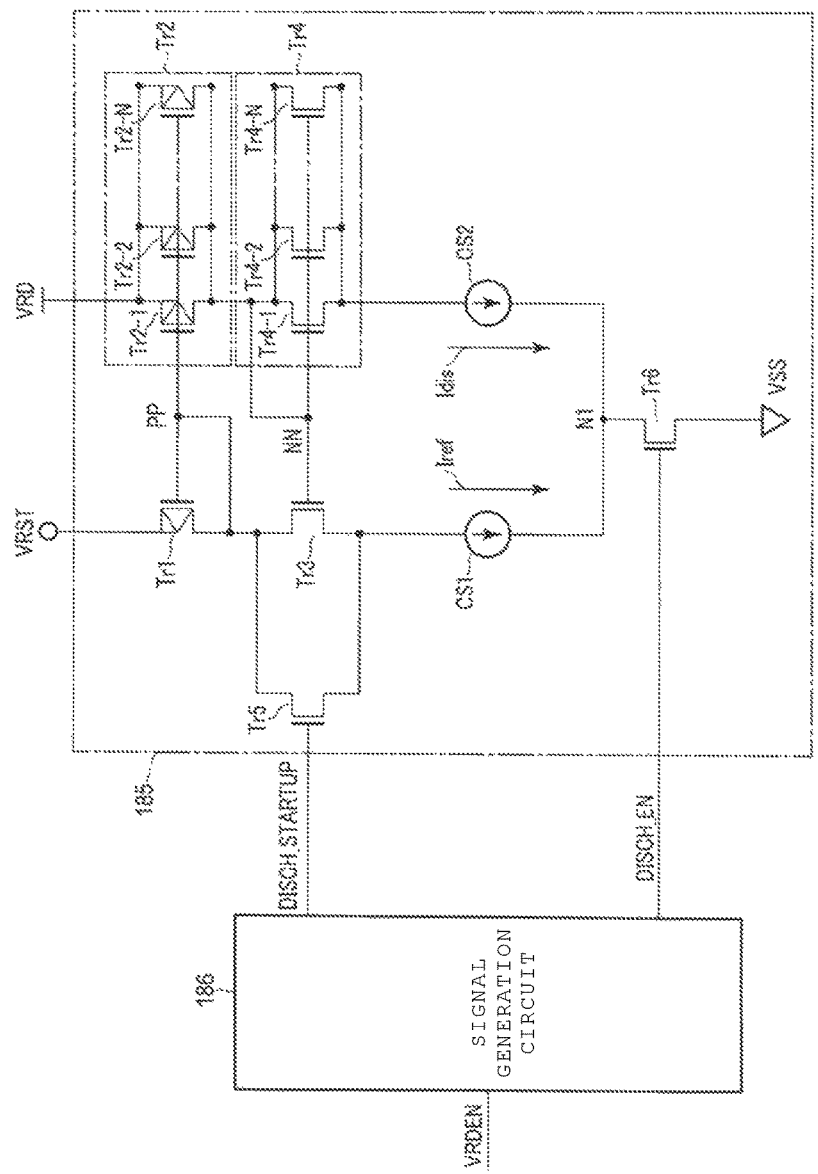
FIG. 10 is a circuit diagram of a discharge circuit of a semiconductor memory device according to a modified example of the first embodiment.

Specifically, as depicted in FIG. 10, the transistor Tr2 may be a transistor group Tr2 of N transistors (Tr2-1, Tr2-2, . . . , and Tr-N), each having the same size as the transistor Tr1, and the transistor Tr4 may be a transistor group Tr4 of N transistors (Tr4-1, Tr4-2, . . . , Tr4-N), each having the same size as the transistor Tr3.

In this case, first ends of the transistors of the transistor group Tr2 are connected to the node VRD, second ends of the transistors of the transistor group Tr2 are connected to the node NN, and the gates of the transistors of the transistor group Tr2 are connected to the node PP. Moreover, first ends and the gates of the transistors of the transistor group Tr4 are connected to the node NN and second ends of the transistors of the transistor group Tr4 are connected to the first end of the constant current source CS2.

Moreover, the above description deals with an example in which, in the discharge circuit 185 according to the first embodiment, the second end of the third transistor Tr3 and the second end of the fourth transistor can receive different voltages, but an embodiment is not limited thereto. Specifically, the second end of the third transistor Tr3 and the second end of the fourth transistor Tr4 may be connected to each other.

In addition to those described above, the following can be applied to each embodiment and each modified example.

In a multilevel read operation (Read), a voltage which is applied to a word line selected for a read operation in an A level is between 0 and 0.55 V, for example. However, an embodiment is not limited thereto, and the voltage may be any voltage between 0.1 and 0.24 V, between 0.21 and 0.31 V, between 0.31 and 0.4 V, between 0.4 and 0.5 V, or between 0.5 and 0.55 V.

A voltage which is applied to a word line selected for a read operation in a B level is between 1.5 and 2.3 V, for example. However, an embodiment is not limited thereto, and the voltage may be any voltage between 1.75 and 1.8 V, between 1.8 and 1.95 V, between 1.95 and 2.1 V, or between 2.1 and 2.3 V.

A voltage which is applied to a word line selected for a read operation in a C level is between 3.0 and 4.0 V, for example. However, an embodiment is not limited thereto, and the voltage may be any voltage between 3.0 and 3.2 V, between 3.2 and 3.4 V, between 3.4 and 3.5 V, between 3.5 and 3.7 V, or between 3.7 and 4.0 V.

The time of the read operation (tR) may be between 25 and 38 μs, between 38 and 70 μs, or between 70 and 80 μs, for example.

A write operation includes a program operation and a verification operation. In the write operation, a voltage which is first applied to a word line selected at the time of the program operation is between 13.7 and 14.3 V, for example. However, an embodiment is not limited thereto, and the voltage may be any voltage between 13.7 and 14.0 V or between 14.0 and 14.7 V, for example.

A voltage which is first applied to a selected word line when writing into an odd-numbered word line is performed may be different from a voltage which is first applied to a selected word line when writing into an even-numbered word line is performed.

If incremental step pulse program (ISPP) is used for the program operation, examples of a step-up voltage include about 0.5 V.

A voltage which is applied to a non-selected word line may be between 7.0 and 7.3 V, for example. However, an embodiment is not limited thereto, and the voltage may be any voltage between 7.3 and 8.4 V or may be 7.0 V or lower, for example.

A pass voltage to be applied may be changed depending on whether a non-selected word line is an odd-numbered word line or an even-numbered word line.

The time of the write operation (tProg) may be between 1700 and 1800 μs, between 1800 and 1900 μs, or between 1900 and 2000 μs, for example.

In an erasing operation, a voltage which is first applied to a well which is formed on a semiconductor substrate, the well above which memory cells are disposed, is between 12 and 13.7 V, for example. However, an embodiment is not limited thereto, and the voltage may be any voltage between 13.7 and 14.8 V, between 14.8 and 19.0 V, between 19.0 and 19.8 V, or between 19.8 and 21 V, for example.

The time of the erasing operation (tErase) may be between 3000 and 4000 μs, between 4000 and 5000 μs, or between 4000 and 9000 μs, for example.

The memory cell has a charge storage layer disposed on a semiconductor substrate (a silicon substrate) with a tunnel insulating film having a film thickness of 4 to 10 nm placed therebetween. The charge storage layer may have a stacked structure of an insulating film, such as SiN or SiON, whose film thickness is 2 to 3 nm and polysilicon having a film thickness of 3 to 8 nm. Moreover, metal such as Ru may be added to polysilicon. On the charge storage layer, an insulating film is formed. This insulating film has, for example, a silicon oxide film having a film thickness of 4 to 10 nm and being sandwiched between a lower High-k film having a film thickness of 3 to 10 nm and an upper High-k film having a film thickness of 3 to 10 nm. Examples of the High-k film include HfO. Moreover, the film thickness of the silicon oxide film may be made greater than the film thickness of the High-k film. On the insulating film, a control electrode having a film thickness of 30 to 70 nm is formed with a material having a film thickness of 3 to 10 nm, placed therebetween. Here, such a material is a metal oxide film such as TaO or a metal nitride film such as TaN. W or the like may be used as the material of the control electrode.

Moreover, an air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A discharge circuit comprising:
   first and second transistors of a first polarity;
   third and fourth transistors of a second polarity different from the first polarity;
   a first current source having a first end electrically connected to a first end of the third transistor and a second end supplied with a first voltage; and
   a second current source having a first end electrically connected to a first end of the first transistor and a second end supplied with the first voltage, wherein
   a first end of the first transistor is supplied with a second voltage higher than the first voltage,
   a first end of the second transistor is electrically separated from the first end of the first transistor,
   a gate and a second end of the first transistor, a gate of the second transistor, and a second end of the third transistor are electrically connected to one another, and
   a second end of the second transistor, a gate of the third transistor, and a second end and a gate of the fourth transistor are electrically connected to one another.

2. The discharge circuit according to claim 1, wherein a current that flows through the second current source is greater than a current that flows through the first current source.

3. The discharge circuit according to claim 2, wherein a size of the second transistor is different from a size of the first transistor, and
   a size of the fourth transistor is different from a size of the third transistor.

4. The discharge circuit according to claim 3, wherein a ratio of the size of the second transistor to the size of the first transistor and a ratio of the size of the fourth transistor to the size of the third transistor are each equal to a ratio of the current that flows through the second current source to the current that flows through the first current source.

5. The discharge circuit according to claim 1, further comprising:
   a fifth transistor that includes a first end electrically connected to the gate of the first transistor and a second end electrically connected to the first end of the first current source; and
   a sixth transistor that includes a first end electrically connected to the second end of the first current source and the second end of the second current source and a second end supplied with the first voltage, wherein
   the first current source and the second current source are supplied with the first voltage via the sixth transistor.

6. The discharge circuit according to claim 1, wherein the second transistor is one of a plurality of transistors connected in parallel between first and second nodes, the first node being electrically connected to the first end of the second transistor and the second node being electrically connected to the second end of the second transistor.

7. The discharge circuit according to claim 6, wherein the fourth transistor is one of a plurality of transistors connected in parallel between third and fourth nodes, the third node being electrically connected to the first end of the fourth transistor and the fourth node being electrically connected to the second end of the fourth transistor.

8. The discharge circuit according to claim 1, wherein the first transistor has a back gate that is electrically connected to the first end thereof and the second transistor has a back gate this is electrically connected to the first end thereof.

9. The discharge circuit according to claim 1, wherein the first polarity is a p-type polarity and the second polarity is an n-type polarity.

10. A semiconductor memory device comprising:
    a plurality of blocks of memory cells; and
    a row decoder supplied with a voltage from a power supply, the row decoder including a plurality of block decoders each corresponding to one of the blocks, each of the block decoders including a regulator circuit and a discharge circuit comprising
    first and second transistors of a first polarity;

third and fourth transistors of a second polarity different from the first polarity;

a first current source having a first end electrically connected to a first end of the third transistor and a second end supplied with a first voltage; and a second current source having a first end electrically connected to a first end of the fourth transistor and a second end supplied with the first voltage, wherein a first end of the first transistor is supplied with a second voltage higher than the first voltage, a first end of the second transistor is electrically separated from the first end of the first transistor and is electrically connected to the power supply through the regulator circuit, a gate and a second end of the first transistor, a gate of the second transistor, and a second end of the third transistor are electrically connected to one another, and a second end of the second transistor, a gate of the third transistor, and a second end and a gate of the fourth transistor are electrically connected to one another.

11. The semiconductor memory device according to claim 10, wherein the regulator circuit is in active state during an operation performed on the memory cells and in an inactive state when not performing an operation on the memory cells, and the regulator circuit, during the active state, supplies a third voltage higher than the second voltage to a node that is electrically connected to the first end of the second transistor and, during the inactive state, electrically isolates the node from the power supply.

12. The discharge circuit according to claim 11, wherein a current that flows through the second current source is greater than a current that flows through the first current source.

13. The discharge circuit according to claim 12, wherein a size of the second transistor is different from a size of the first transistor, and a size of the fourth transistor is different from a size of the third transistor.

14. The discharge circuit according to claim 13, wherein a ratio of the size of the second transistor to the size of the first transistor and a ratio of the size of the fourth transistor to the size of the third transistor are each equal to a ratio of the current that flows through the second current source to the current that flows through the first current source.

15. The discharge circuit according to claim 11, wherein the discharge circuit further comprises:

a fifth transistor that includes a first end electrically connected to the gate of the first transistor and a second end electrically connected to the first end of the first current source; and a sixth transistor that includes a first end electrically connected to the second end of the first current source and the second end of the second current source and a second end supplied with the first voltage, wherein the first current source and the second current source are supplied with the first voltage via the sixth transistor.

16. The discharge circuit according to claim 11, wherein the second transistor is one of a plurality of transistors connected in parallel between first and second nodes, the first node being electrically connected to the first end of the second transistor and the second node being electrically connected to the second end of the second transistor.

17. The discharge circuit according to claim 16, wherein the fourth transistor is one of a plurality of transistors connected in parallel between third and fourth nodes, the third node being electrically connected to the first end of the fourth transistor and the fourth node being electrically connected to the second end of the fourth transistor.

18. The discharge circuit according to claim 11, wherein the first transistor has a back gate that is electrically connected to the first end thereof and the second transistor has a back gate this is electrically connected to the first end thereof.

19. The discharge circuit according to claim 11, wherein the first polarity is a p-type polarity and the second polarity is an n-type polarity.

20. The discharge circuit according to claim 10, wherein the first polarity is a p-type polarity and the second polarity is an n-type polarity.

* * * * *